(12) United States Patent
Davis et al.

(10) Patent No.: US 6,432,511 B1
(45) Date of Patent: *Aug. 13, 2002

(54) THERMOPLASTIC ADHESIVE PREFORM FOR HEAT SINK ATTACHMENT

(75) Inventors: John G. Davis, Charlotte, NC (US); Michael A. Gaynes, Vestal, NY (US); Joseph D. Poole, Troutman, NC (US)

(73) Assignee: International Business Machines Corp., Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 653 days.

(21) Appl. No.: 08/864,726

(22) Filed: Jun. 6, 1997

(51) Int. Cl.[7] ................................. B32B 3/00
(52) U.S. Cl. ................ 428/156; 156/87; 156/306.6; 165/80.2; 165/138; 264/163
(58) Field of Search ............... 156/306.6, 87; 264/163; 165/80.2, 138; 428/156

(56) References Cited

U.S. PATENT DOCUMENTS

| | | |
|---|---|---|
| 4,029,628 A | 6/1977 | Fredberg |
| 4,609,898 A | 9/1986 | Seymour et al. |
| 4,820,446 A * | 4/1989 | Prud'Homme ............... 524/439 |
| 5,057,903 A | 10/1991 | Olla |
| 5,366,688 A | 11/1994 | Terpstra et al. |
| 5,401,455 A | 3/1995 | Hatfield et al. |
| 5,523,049 A | 6/1996 | Terpstra et al. |

FOREIGN PATENT DOCUMENTS

JP 55-41286 * 3/1980 ............... 156/306.6

* cited by examiner

*Primary Examiner*—John J. Gallagher
(74) *Attorney, Agent, or Firm*—McGuireWoods LLP; Lawrence Fraley

(57) ABSTRACT

Curved surfaces of a preform of thermoplastic adhesive provide improved regulation of heating and exclusion of gas as surfaces to be bonded are heated and pressed against the thermoplastic adhesive preform. Particulate or filamentary materials can be added to the thermoplastic adhesive for adjustment of coefficient of thermal expansion or further increase of heat transfer through the adhesive or both. The preform is preferably fabricated by molding, preferably in combination with die-cutting of a preform of desired volume from a web of approximately the same thickness as the completed bond.

5 Claims, 1 Drawing Sheet

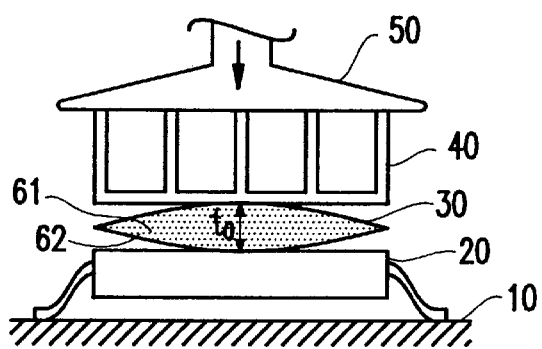
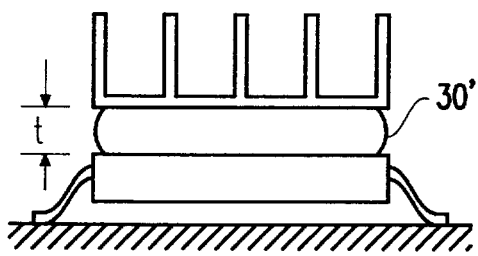
FIG.1  FIG.2
FIG.1A
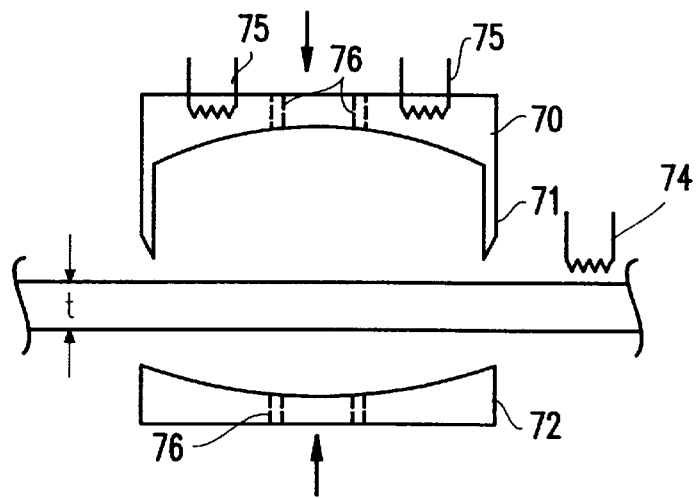
FIG.3

THERMOPLASTIC ADHESIVE PREFORM FOR HEAT SINK ATTACHMENT

This application is related to co-pending U.S. patent application Ser. No. 08/870,800 filed concurrently herein.

BACKGROUND OF THE INVENTION

1. Field of the Invention

The present invention generally relates to bonding of heat sinks to integrated circuit packages and, more particularly, to improving heat transfer through adhesive bonds as well as improving integrity and robustness of the adhesive bonds.

2. Description of the Prior Art

Heat dissipation is a major factor in the design of semiconductor devices such as analog and power transistors and especially in high performance digital switching circuits formed at high integration density. Ideally, in switching devices, heating is produced only during the switching transition interval and a small resistance in the "on" state. However, in high-performance circuits which provide very rapid switching transitions, it is generally the practice to exploit rapid switching by increasing the clock frequency so that the switching transition occupies a relatively constant portion of a clock period. Therefore, heat dissipation requirements generally increase with clock speed for each switching transistor.

Further, to exploit this increased clock frequency and to obtain reduced susceptibility to noise (as well as reduce manufacturing costs) there is substantial incentive to fabricate high-performance switching elements at the maximum possible integration density to minimize the length of signal paths therebetween. Therefore heat dissipation requirements also increase proportionally with integration density.

Accordingly, it has recently become the practice to incorporate attachment of a heat sink or other heat removal structure (e.g. a liquid-cooled cold plate) into the design and manufacture of integrated circuit packages since heat removal is critical to both performance and reliability of the integrated circuit. In this regard, incorporation of the heat sink with the fabrication of the package is justified by the criticality of heat transfer from the package to the heat sink since uneven cooling may cause stresses within the chip or between the package and the heat sink. Thermal cycling can then damage the circuit elements (e.g. diffusion or oxide growth) or connections formed on the chip (e.g. metal fatigue or migration) or degrade the attachment of the heat sink to the package which will then tend to increase the temperature excursion during thermal cycling.

For attachment of heat sinks to integrated circuit packages, it has been the practice to use an adhesive which has a relatively good thermal conductivity. However, the thermal conductivity of such materials is still very low compared to metals. For example, the thermal conductivity of a thermally conductive adhesive in current use is only about 1.73 W/m-°C. whereas copper has a thermal conductivity of 395 W/m-°C. Additionally, the interfaces of the package to the adhesive and the adhesive to the heat sink further,impede heat transfer. Therefore, it can be understood that the adhesive connection of the heat sink is critical to both the thermal and electrical performance of the combination of chip, package and heat sink.

Specifically, the cross-section of the thermal path must be maximized and should not be compromised by gas or air bubbles. Such bubbles present a region of reduced thermal conductivity and two additional interfaces to impede heat flow. Further, thermal cycling causes expansion of the gas or increase of pressure within the bubble which can cause progressive breakage of the adhesive bond.

Additionally, it is known that a certain volume of adhesive is necessary to provide sufficient robustness of the bond to resist damage thereto by routine handling before or after the package is placed in service and the same applies to damage from gas or air bubbles, as well. On the other hand, since the thermally conductive adhesive has a significant thermal resistance, the length of the thermal path through the bond should be no more that required by the volume of adhesive necessary to a robust bond. Therefore, the thickness of the adhesive bond is relatively critical to the thermal performance of the integrated circuit package as well as structural integrity of the bond itself.

It has therefore been the practice to bond heat sinks to integrated circuit packages with a reworkable thermoplastic adhesive which is initially in the form of a sheet of a thickness designed to provide the proper volume and thickness of the bond. In this sense, the sheet is essentially an adhesive preform and presents the problems of a requirement for heating the entire assembly to form the bond and capturing air or gas at the surfaces of the sheet while the assembly is pressed together for heating and bonding. Throughput is low due to the thermal mass which must be heated and cooled.

A dispensable adhesive is an alternative to an adhesive preform. Unfortunately, dispensable adhesives do not fully solve the problems of a preform and present others. While air or gas will not generally be trapped by a dispensable adhesive that can flow when parts are pressed together, the thickness of the adhesive bond cannot be well-regulated. Further, good handling characteristics of dispensable adhesives such as ease of dispensing, long storage and pot life and short cure time generally imply poor thermal performance and vice-versa. Poor thermal characteristics increase the criticality of the adhesive bond thickness. Epoxies with suitable thermal conductivity, after mixing, must stay frozen until use, require special dispensing equipment, have a short working life and require a long oven cure. Suitable cyanoacrylate adhesives also require special dispensing equipment, the addition of an activator for curing and require only light handling, at most, for several hours after the bond is made. Either the long oven cure required by the epoxy or the period of restriction on handling of the device causes a restriction on the duration of the manufacturing process.

Accordingly, it can be seen that known alternatives for bonding heat sinks to circuit packages all present some unavoidable complexity in the manufacturing process and the possibility of compromising manufacturing yield or reliability.

SUMMARY OF THE INVENTION

It is therefore an object of the present invention to provide a thermoplastic adhesive preform which avoids entrapment of air or gases while providing precise control of adhesive volume and bond thickness.

It is another object of the invention to provide enhancement of heat conduction through an adhesive bond while improving accuracy and repeatability of bond thickness.

It is a further object of the invention to provide for use of an adhesive which does not require dispensing, is reworkable without damage to an electronic circuit package and may be conveniently handled and stored prior to use for bonding heat sinks to electronic circuit packages.

In order to accomplish these and other objects of the invention, a method of attaching a heat removal structure to an electronic circuit package is provided including the steps of forming a curved surface on a preform of thermoplastic adhesive, and heating and compressing the preform between the electronic circuit package and the heat removal structure to form an adhesive bond having a desired thickness.

In accordance with another aspect of the invention, a method for making a preform of thermoplastic adhesive having a curved surface is provided including the steps of placing a desired volume of thermoplastic adhesive in a mold, and applying heat and pressure to said volume of thermoplastic adhesive until it conforms to a curved inner surface of said mold.

In accordance with a further aspect of the invention, an adhesive preform of thermoplastic material is provided including at least one curved major surface for contacting a surface to be bonded over a progressively larger area as a bond of desired final thickness is formed.

BRIEF DESCRIPTION OF THE DRAWINGS

The foregoing and other objects, aspects and advantages will be better understood from the following detailed description of a preferred embodiment of the invention with reference to the drawings, in which:

FIG. 1 is a cross-sectional view of a preferred form of a thermoplastic adhesive preform in accordance with the invention prior to bonding, FIG. 1A is a plan view of the preform of FIG. 1, FIG. 2 is a cross-sectional view of a completed bond between an electronic circuit package and heat sink using the preform of FIG. 1, and FIG. 3 is a cross-sectional view of a preferred method of forming the thermoplastic preform of FIG. 1.

DETAILED DESCRIPTION OF A PREFERRED EMBODIMENT OF THE INVENTION

Referring now to the drawings, and more particularly to FIG. 1, there is shown, in cross-sectional view, an adhesive preform 30 in accordance with the invention together with an electronic package 20 and a heat sink 40 which are to be bonded thereby. As alluded to above, when a bond is to be formed, the electronic package 20 and the heat sink 40 are assembled together with the thermoplastic preform 30 sandwiched therebetween and the package and heat sink pressed toward each other (e.g. by support 10 and press 50) while the entire assembly is heated. Heating of the entire assembly can be reduced somewhat by preheating of the adhesive preform prior to assembly., It can be readily appreciated that if the adhesive preform is substantially flat, irregularities in the surface of the package 20, preform 30 and/or heat sink 40 will prevent intimate contact over the entire interfaces between these components prior to bonding. Thus when the surfaces are pressed together, ambient gases will be trapped resulting in compromise of both heat transfer and the integrity and robustness of the bond. At the same time, heat transfer from the package and heat sink to the adhesive preform is irregular prior to bonding due to lack of intimate contact to the preform. Further, it should be appreciated that during heating to form the bond while the assembly is under compression, the adhesive will flow somewhat and can extrude from the edges of the bond. Therefore, a flat preform does not provide regulation of the amount of adhesive in the bond or the thickness of the bond, particularly where gas may be trapped between the package and or heat sink and the preform.

The same is especially true of dispensed adhesives where adhesive may be distributed in lines or dots over either or both of the surfaces to be joined. Such discontinuities in the pattern of adhesive, as applied, is particularly subject to the trapping of ambient gases as the adhesive is compressed and flows between the surfaces to be bonded. Trapped gas will thus cause extrusion of more than the intended amount of adhesive if the intended thickness of the bond is obtained, resulting in less than the intended amount of adhesive remaining in the bond, or, alternatively, the thickness of the bond will be increased by an amount corresponding to the volume of the trapped gas. Both of these effects or any degree of combination of the two compromises both heat transfer and bond integrity.

To provide for avoidance of the trapping of gases in accordance with the invention, preform 30 is formed with a slight degree of curvature in the top and bottom surfaces thereof so that the preform is of a convex or pillow-like shape in cross-section. It is preferred that the amount of curvature be chosen such that the initial maximum thickness $t_0$ of the preform be at least 1.5 times the thickness of the final design thickness, t, (shown in FIG. 2) of the bond. Alternatively, the curvature should be chosen in accordance with the dimensions of surface irregularities of the preform to avoid closing of any concave depression in the surface of the preform before gases can be excluded therefrom by deformation and flow of the preform such that the convex surface contacts a progressively larger area of a surface to be bonded as a bond of desired design thickness is formed. It should also be appreciated that the curvature provides an intimate contact between the central area of the package 20 and/or heat sink 40 with the central portion of the preform 30 so that heating of the preform will be both rapid and progressive, aiding the exclusion of gases as the preform material is progressively allowed to flow. In a limiting case, the preform 30 could be in the shape of a sphere of appropriate volume to accommodate relatively extreme surface roughness of the preform if such surface roughness was not otherwise avoidable.

It is also considered desirable in view of the viscous flow of the adhesive under compression and at a suitably elevated temperature that the perimeter of the preform 30 be slightly smaller than the dimensions of surfaces to be bonded, as indicated at 25 of FIG. 1A, and slightly concave in plan view so that the final shape of the preform 30' will conform closely to that (25) of the areas to be bonded. Thus, since the volume and shape of the adhesive can be controlled and trapping of gases can be avoided, the onset of extrusion of adhesive 30' from between the surfaces to be bonded can be detected used to regulate the final thickness, t, of the bond, as shown in FIG. 2, by terminating heating and compression and the cross-sectional area of the heat transfer path will be similarly well-regulated.

As a perfecting feature of the invention, possible compromise of the robustness of the bond will be reduced as the coefficient of thermal expansion of the adhesive is matched (e.g. by choice of thermoplastic adhesive material or the use of additional fill material 61 in a particulate or powder form) to that of the heat sink and/or electronic package. However, the closeness of the match is not at all critical to the practice of the invention.. As a further perfecting feature of the invention, particulate or filamentary form material 62 of high thermal conductivity can be added to the adhesive of the preform to increase thermal conductivity of the adhesive.

Referring now to FIG. 3, methods for forming the preforms of FIG. 1 will be discussed. A preferred technique is to simply die cut and simultaneously form the preforms 30 from a sheet or continuous web 80, which may have particulate or filamentary additives 61, 62 embedded therein, using a punch 70 and die 72 which have a shaped concave interior. The web 80 can then advantageously be of approximately the same thickness as the intended thickness, t, of the completed bond.

The initial die cutting of the sheet or web 80 by-punch blade 71 against die 72 establishes the amount of thermoplastic adhesive to form the bond and, as the punch 70 and die 72 are driven further together, the thermoplastic material, heated by heaters 74 and/or 75 is pinched at the edges and forced to flow toward the center of the preform or mold to form a pillow-like shape with curved surfaces. Gases are allowed to escape from the shaped interior of the punch 70 and die 72 through vents 76. Thus, the preform is substantially molded to the desired shape and any residual stress in the preform will assist in causing adhesive flow in the preform which assists in achieving the desired shape of the completed bond (which will be substantially the same as that when originally cut from sheet or web 80).

It should be understood that FIG. 3 can also be understood as being illustrative of injection molding and other molding processes with the exception that in the latter case, a cutting edge 71 need not be provided. The mold can also be charged with a preform of adhesive material of appropriate volume in an arbitrary shape (such as a sphere or a pellet of, for example, ellipsoid or cylindrical shape) for molding to the preferred pillow shape with curved surfaces.

It should be noted from the foregoing, that the use of a thermoplastic material allows the adhesive bond to be softened by the application of heat so that a heat sink can be removed from an electronic circuit package without damage to the package. The bonding material can also be easily removed from both the heat sink and the electronic package and, moreover, may be recovered and reformed by molding in the manner described above for reuse.

In view of the foregoing, it is seen that the invention provides for reliably and repeatably avoiding the entrapment of gases while forming a reworkable bond of a heat removal structure such as a heat sink or cold plate to an electronic circuit package. The thermoplastic adhesive preforms also provide for accuracy of bond volume and thickness, the avoidance of dispensing and ease of handling and storage of the adhesive prior to use. Design dimensions of the bond to optimize bond integrity and robustness are accurately realized to optimize heat transfer while allowing a portion of the volume and area of the bond to be allocated to materials for increasing heat transfer capacity across the adhesive bond and/or adjustment of the coefficient of thermal expansion of the adhesive.

While the invention has been described in terms of a single preferred embodiment, those skilled in the art will recognize that the invention can be practiced with modification within the spirit and scope of the appended claims.

What is claimed is:

1. An adhesive preform of thermoplastic material for bonding facing surfaces of upper and lower components of an electronic package, the adhesive preform comprising opposing convex curved surfaces, the perimeter of the adhesive preform having concave shape edges.

2. An adhesive preform as recited in claim 1, wherein a maximum initial thickness of said preform is at least 1.5 times said desired final thickness of said bond.

3. An adhesive preform as recited in claim 1, further comprising particulate material for adjusting a coefficient of thermal expansion of said thermoplastic material.

4. An adhesive preform as recited in claim 1, further comprising particulate or filamentary material for increasing heat conductivity of said thermoplastic material.

5. An adhesive preform as recited in claim 3, further comprising particulate or filamentary material for increasing heat conductivity of said thermoplastic material.

* * * * *